(12) United States Patent
Kim

(10) Patent No.: US 7,495,340 B2
(45) Date of Patent: Feb. 24, 2009

(54) METAL LAYER STRUCTURE OF SEMICONDUCTOR DEVICE

(75) Inventor: Jong Hoon Kim, Seongnam-Si (KR)

(73) Assignee: Hynix Semiconductor Inc., Gyeonnggi-do (KR)

( * ) Notice: Subject to any disclaimer, the term of this patent is extended or adjusted under 35 U.S.C. 154(b) by 288 days.

(21) Appl. No.: 11/646,698

(22) Filed: Dec. 28, 2006

(65) Prior Publication Data

US 2008/0079161 A1    Apr. 3, 2008

(30) Foreign Application Priority Data

Sep. 29, 2006    (KR) .................... 10-2006-0096060

(51) Int. Cl.
*H01L 23/48* (2006.01)
*H01L 23/52* (2006.01)

(52) U.S. Cl. ............... 257/774; 257/758; 257/775; 257/776; 257/E21.597; 257/E21.575

(58) Field of Classification Search ......... 257/774–776, 257/758, E21.575, E21.597, E21.627, E21.641
See application file for complete search history.

(56) References Cited

U.S. PATENT DOCUMENTS 5,976,972 A * 11/1999 Inohara et al. ............. 438/640
6,781,235 B1 * 8/2004 Givens ....................... 257/758

FOREIGN PATENT DOCUMENTS

| KR | 1997-0072314 | 11/1997 |
|----|--------------|---------|
| KR | 1999-0065383 | 8/1999 |
| KR | 10-2004-0039593 | 5/2004 |
| KR | 10-0719694 | 5/2007 |

* cited by examiner

*Primary Examiner*—Theresa T Doan
(74) *Attorney, Agent, or Firm*—Marshall, Gerstein & Borun LLP

(57) ABSTRACT

A metal layer structure of a semiconductor memory device is disclosed. The metal layer structure includes: a first metal layer to be connected to a contact plug; and a plurality of a second metal layers that are formed in parallel at a second spaced distance around the first metal layer, wherein a spaced distance of the second metal layers nearest the first metal layer maintains the second spaced distance which is wider than a first spaced distance of the second metal layers around the contact plug, and the spaced distance of the second metal layer next to the first metal layer maintains a third spaced distance, which is narrower than the second spaced distance, and the spaced distance between adjacent second metal layers gradually decreases to eventually be equal to the first spaced distance, for the second metal layers farthest from the first metal layer. Accordingly, an alignment margin can be ensured without requiring more area, and the contact plug can be connected to the next metal layer, even if an alignment error is produced.

8 Claims, 3 Drawing Sheets

METAL LAYER STRUCTURE OF SEMICONDUCTOR DEVICE

BACKGROUND OF THE INVENTION

1. Field of the Invention

The invention relates generally to a metal layer structure for a semiconductor device and, more particularly, to a metal layer structure of a semiconductor device for securing an alignment margin between a contact plug and a metal layer.

2. Related Technology

In a semiconductor device, a metal layer is formed as a bundle, and a lower metal layer and an upper metal layer are electrically connected with a contact plug. As the degree of integration of a device is increased, spaces between metal layers become more narrow. Meanwhile, to form a metal layer, a conductive film for a metal layer is formed, and photoresist is applied thereon. The photoresist is then patterned through a photolithography and development process using a metal mask to define a region for a metal layer to be formed. Then, the conductive film for a metal layer is etched using the photoresist pattern as an etching mask. As a result, a metal layer is formed.

For a metal layer to be connected to another lower metal layer, alignment with a contact plug has to be made. However, as the width of the metal layer and the space between metal layers becomes more narrow, the alignment margin with a contact plug is decreased and thus it is difficult to accurately align a metal layer with a contact plug. In particular, in a photolithography process of the photoresist, in the case where a mask is not aligned accurately and thus the region for a metal layer to be formed is not defined accurately, the error of an alignment with a contact plug may be produced. As a result, the contact area between the metal layer and contact plug is decreased to increase the resistance thereof, or they are not in contact with each other, resulting in a failure. In addition, one metal layer adjacent to another metal layer to be connected to a contact plug, is connected to the contact plug resulting in a failure.

In addition, current photolithography equipment is limited in its ability to overlay and thus to form a metal layer, and it is difficult to form the metal layer to be connected accurately to a lower contact plug.

In a case of a memory device, more metal layers in a core region are formed than that in a cell region, and thus it is important to ensure an alignment margin therein and further the alignment margin had to be improved in taking into consideration of a pattern size to be smaller.

FIGS. 1A and 1B are views showing conventional metal layers of a semiconductor device. A contact plug 11 is formed over a substrate on which a lower structure (not shown) such as a transistor is formed. Then, a conductive film for a metal layer is formed over the contact plug 11 and a patterning process is performed thereon to form metal layers 12a to 12c. At this time, some metal layers are connected to the contact plug 11. Here, it is an important aspect that the contact plug 11 is aligned accurately with the metal layer 12a and a predetermined space has to be formed such that the metal layer 12b or 12c, which is adjacent to the metal layer 12a, is not connected to the contact plug 11.

However, in the case where the space between the metal layers is very narrow and thus a mask is not aligned accurately in a photolithography process, the metal layer 12b or 12c, which is adjacent to the metal layer 12a to be connected to the contact plug 11, is connected to the contact plug 11 resulting in a failure. In addition, only a part of the contact plug 11 is connected to the metal layer 12a to decrease a contact surface, thereby increasing the resistance thereof.

Here, a method for widening the space between the metal layers may be proposed to solve the above drawback; however, it causes the chip size to increase, thereby reducing efficiency. In addition, in the case where an area of the contact plug 11 is decreased, it becomes difficult to align with the metal layer 12a to be connected to the contact plug 11, and in the case where an area of the contact plug 11 is increased, the space between metal layers has to be increased, which adversely affects the degree of integration.

SUMMARY OF THE INVENTION

Accordingly, the invention provides a metal layer structure of a semiconductor device in which overlapping between the contact layers and metal layers can be avoided by forming a pattern of bending metal layers adjacent the contact among metal layers, and the margin width of the space next to the contact is maintained and then decreases gradually as the distance from the contact increases, and thus an overlay margin can be ensured while maintaining the entire chip size.

The invention provides a metal layer structure of a semiconductor memory device, including a first metal layer to be connected to a contact plug; and a plurality of second metal layers that are formed in parallel at a second spaced distance around the first metal layer, wherein a spaced distance of the second metal layers nearest the first metal layer maintains the second spaced distance which is wider than a first spaced distance of the second metal layers around the contact plug, and the spaced distance of the second metal layer next to the first metal layer maintains a third spaced distance, which is narrower than the second spaced distance, and the spaced distance between adjacent second metal layers gradually decreases to eventually be equal to the first spaced distance, for the second metal layers farthest from the first metal layer.

The second metal layers, which preferably have a length corresponding to 1.2 to 2.0 times the overlapped length of the first metal layer and contact plug around the contact plug, maintain a spaced distance from the first metal layer, which is wider than the first spaced distance.

The spaced distance between adjacent second metal layers preferably decreases gradually by 1 nm to 10 nm, as the second metal layer gets farther from the first metal layer.

Preferably, there are at least eight second metal layers, and the spaced distance between the seventh second metal layer and the eighth second metal layer nearest from the first metal layer maintains the first spaced distance.

The first spaced distance is preferably 100 nm, and the second spaced distance is preferably 115 nm.

The second metal layers are preferably formed to have a first width and further the second metal layers are formed to have a second width on the region where the spaced distance next to the second metal layer gets wider, which is narrower than the first width.

The width of the second metal layer preferably decreases by 1 nm to 10 nm. The first width is preferably 100 nm.

BRIEF DESCRIPTION OF THE DRAWINGS

The following drawings, which are included to provide a further understanding of the invention and are incorporated in and constitute a part of this specification, illustrate embodiments of the invention and together with the description serve to explain the principle of the invention. In the drawings.

DESCRIPTION OF SPECIFIC EMBODIMENTS

In the following, preferred embodiments of the invention are described in conjunction with the accompanying drawings. However, both the foregoing general description and the following detailed description are exemplary and are intended only to provide further explanation of the invention as claimed.

Figure 2:
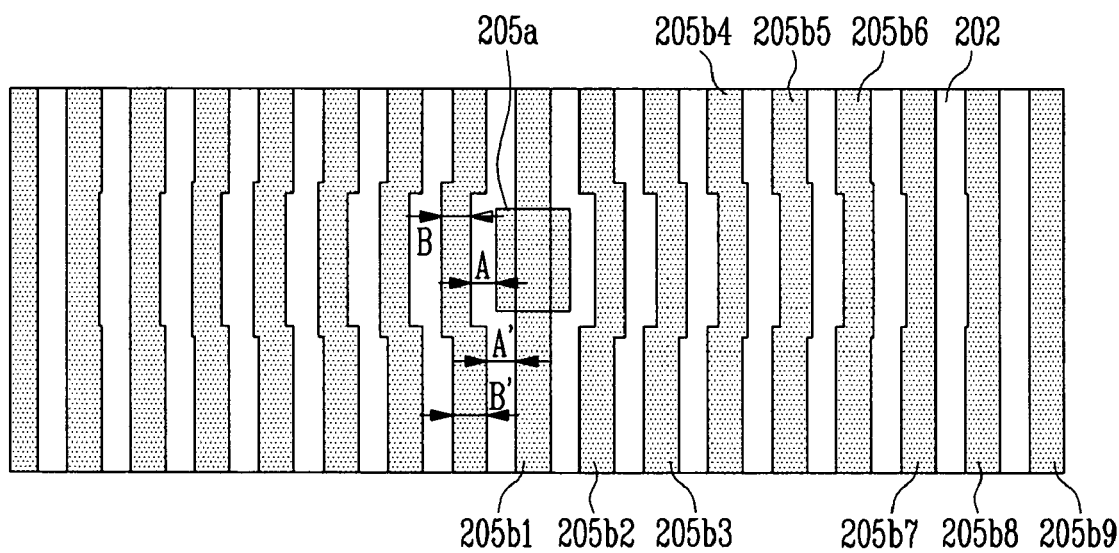
FIG. 2 is a view showing a layout of a manufacturing method for a flash memory device according to an embodiment of the invention.

FIG. 2 is a view showing a layout of a manufacturing method for a flash memory device according to an embodiment of the invention. A first metal layer 205b1 and a plurality of second metal layers 205b2 to 205b9 formed in parallel around the first metal layer 205b1 and spaced at a distance (A'), are disposed over an interlayer film 202. Here, more numbers of the second metal layers may be formed than that shown in FIG. 2; however, for clarity of a description, only eight metal layers are shown. Meanwhile, the second metal layers 205b2 to 205b9 may be formed in symmetry around the first metal layer 205b1. These types of metal layers can be formed on a core region of a memory device. Hereinafter, for clarity of a description, it is assumed that the number of metal layers is 17, the width of metal layers is 100 nm, and the spaced distance (A') is 100 nm.

In other words, the first metal layer 205b1 and second metal layers 205b2 to 205b9 are formed in parallel in a width of 100 nm at a spaced distance (A') of 100 nm. Meanwhile, the first metal layer 205b1 is connected to a contact plug 205a. Here, the contact plug 205a is formed in a wider width than that of the first metal layer 205b1, taking into consideration a potential alignment error with the first metal layer 205b1. Accordingly, in case an alignment error is produced, the second metal layer 205b2 nearest the first metal layer 205b1 could potentially be connected to the contact plug 205a. For the purpose of avoiding this, the spaced distance between the first metal layer 205b1 and second metal layers 205b2 to 205b9 is increased to a second spaced distance (A) such that even if an alignment error is produced, the contact plug 205a will not be connected to the second metal layer 205b2 nearest the first metal layer 205b1. At this time, the second metal layer 205b2, which has a length of 1.1 times to 2.0 times the overlapped length between the first metal layer 205b1 and contact plug 205a, is formed at a spaced distance (A) from the first metal layer 205b1. In the other region, the spaced distance (A') between the first metal layer 205b1 and second metal layer 205b2, and the second metal layers 205b2 to 205b9, is maintained.

Meanwhile, in a description of the spaced distance around the contact plug 205b1, the spaced distance between the second metal layers 205b2 to 25b9 becomes narrower farther from the first metal layer 205b1, that is, from the contact plug 205a1, to eventually be the same spaced distance as first spaced distance (A'). For example, around the contact plug 205a, the first spaced distance (A') between the first metal layer 205b1 and second metal layer 205b2 is set to be the second spaced distance of 115 nm, which is wider than the first spaced distance of 100 nm. The respective widths of the second metal layers 205b2 to 205b9 are narrowed by 1 nm and the spaced distances between the second metal layers 205b2 to 205b9 from the first metal layer 205b1, are decreased by 1 nm, and then the spaced distance between the seventh and eighth second metal layers 205b8, 205b9 from the first metal layer 205b1 will become 100 nm, the same as the first spaced distance (A'). Accordingly, the spaced distance between the seventh and eighth second metal layers 205b8, 205b9 maintains 100 nm of the first spaced distance (A') on the whole structure. By adjusting spaced distances in the aforementioned manner, on the region where the contact plug 205a is to be formed, the left and right spaced distances between the first metal layer 205b1 and second metal layer 205b2 are increased respectively by 15 nm to ensure an alignment margin with the contact plug 205a by a further 15 nm, respectively. Here, the decrease and increase of the spaced distances between metal layers are not limited to 1 nm, and it can varied depending on a design rule or a definition ability of photolithography equipment. For example, the decrease and increase of a spaced distance between metal layers may be set to be 1 nm to 10 nm.

Here, it is preferable to adjust the widths of the second metal layers 205b2 to 205b9 that are adjusted in the spaced distances, together with adjusting the spaced distances between the first metal layer 205b1 and second metal layers 205b2 to 205b9. More specifically, in a limited area, in a state of maintaining a width of a metal layer as a constant, it is difficult to enlarge only a spaced distance. Therefore, it is preferable to decrease the widths of a few second metal layers, among the whole second metal layers 205b2 to 205b9, between which the spaced distances are widened. For example, in the case where the respective widths (B') of the second metal layers 205b2 to 205b9 are 100 nm, the width thereof is decreased by 1 nm, which corresponds to a increased value of a spaced distance, to be 99 nm on the region where the spaced distance from the first metal layer 205b1 is widened. Accordingly, the second metal layers 205b2 to 205b9 are formed to have respectively a width (B') of 100 nm, and to have a width of 99 nm on only the region where the spaced distance from the first metal layer 205b1 is widened. Therefore, the second metal layer 205b9 maintaining a spaced distance of 100 nm as the first spaced distance (A') on all parts thereof is formed to have a width of 100 nm on all parts thereof and thus adjusting of a spaced distance can be easily done within a limited area. Similarly, the variations in the widths of the second metal layers are not limited to 1 nm, and it can varied depending on a design rule or a definition ability of photolithography equipment. For example, the decrease and increase of a spaced distance between metal layers may be set to be 1 nm to 9 nm. In forming the metal layers in the aforementioned manner, continuous features of repeated patterns are ensured, since in the case where the irregular metal layers are formed, or the metal layers and the spaced distances between the metal layers are not repeated, it may be a factor to cause a formation of a photolithography process between devices to be difficult.

In forming patterns of metal layers, even when adjusting the widths of the metal layers and spaced distances therebetween, the whole size of a chip has to be maintained for aligning with other devices. Accordingly, only predetermined regions of the second metal layers 205b2 to 205b9 around the contact plug 205a are widened on the left side and right side to form a pattern. At this time, the predetermined regions refers to the area larger than the contact plug 205a, that is, as 1.1 to 2.0 times as the contact plug 205a. Meanwhile in other region excluding the increased region, the width (B') of the second metal layers 205b2 to 205b9 and spaced distance (A') between the second metal layers 205b2 to 205b9 maintains as conventional values.

A manufacturing method for a semiconductor device according to the invention is disclosed follows.

FIGS. 3A to 3D are cross-sectional views showing a manufacturing method for a semiconductor device according to an embodiment of the invention.

Figure 1A:
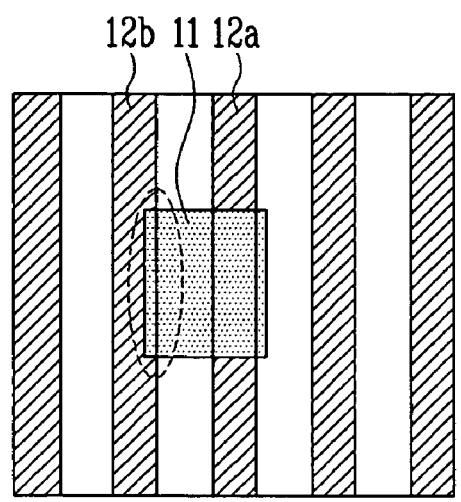
FIGS. 1A and 1B are views showing conventional metal layers of a semiconductor device.
Figure 1B:
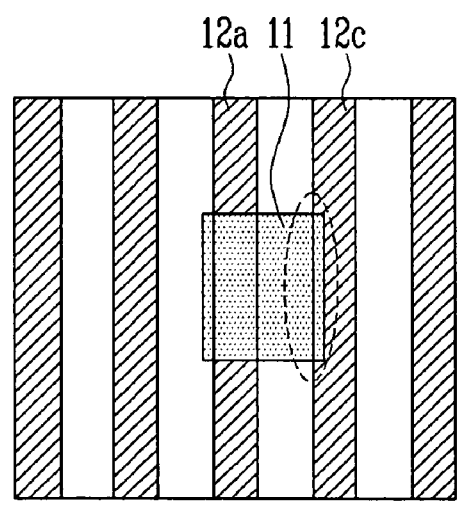
Figure 3D:
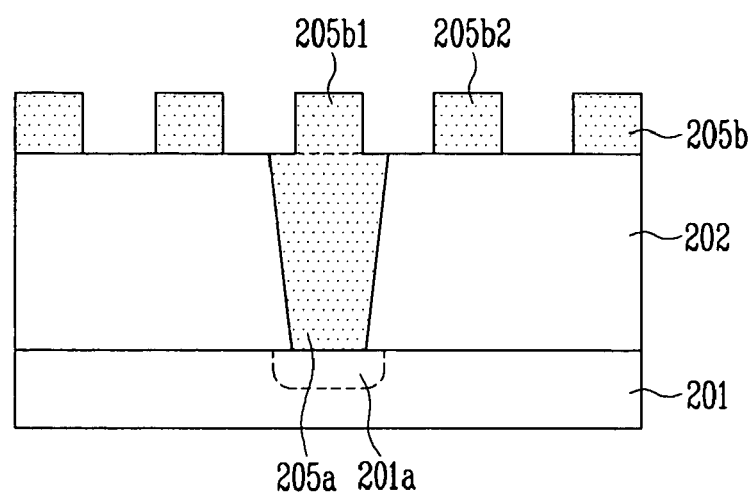
FIGS. 3A to 3D are cross-sectional views showing a manufacturing method for a semiconductor device according to an embodiment of the invention.
Figure 3A:
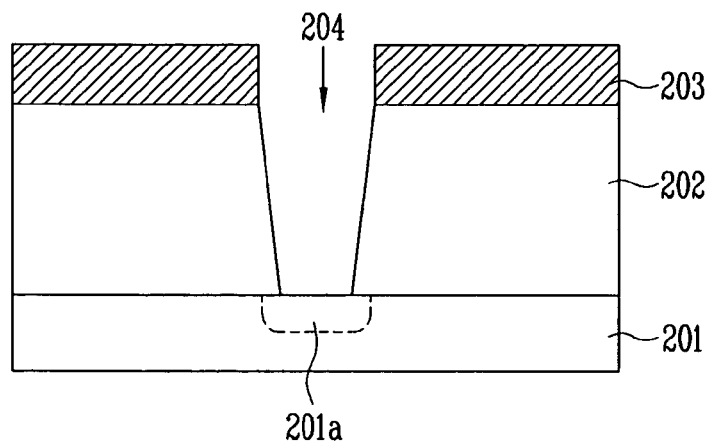

Referring to FIG. 3A, an oxidation film for an interlayer insulating film 202 is formed over the semiconductor substrate 201 on which junction region 201a is formed. A first photoresist is formed on over the interlayer insulation film to form a contact hole 204. A first photoresist pattern 203 is formed by performing a photolithography and development process to strip the region where the contact hole 204 is to be formed. The contact hole 204 is formed on the interlayer film 202 by an etching process in accordance with the first photoresist pattern 203.

Figure 3B:
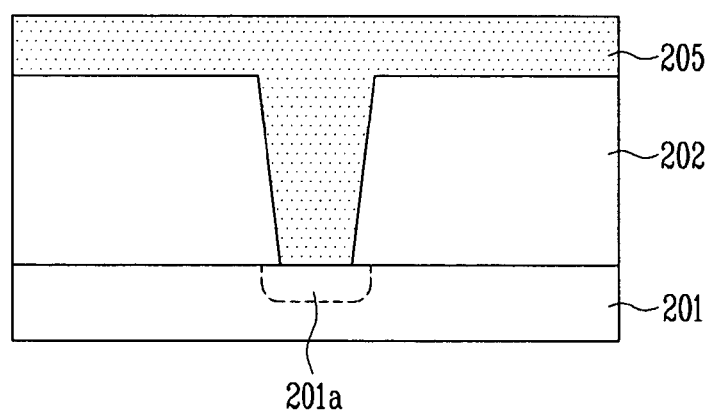

Referring to FIG. 3B, a conductive film 205 is formed to bury the contact hole 204. The conductive film 205 is formed to form a contact plug and a metal layer. The process of forming a conductive film to form a contact plug and a metal layer can be performed in various ways, and in the invention, a manner of simultaneously forming the contact plug and the metal layer is described. The upper part of the conductive film 205 is planarized using a chemical and mechanical polishing.

Figure 3C:
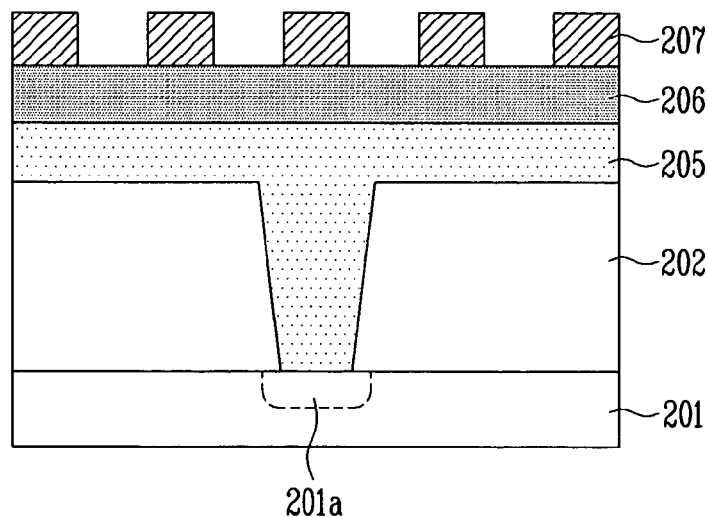

Referring to FIG. 3C, a metal mask 206 and a second photoresist are formed over the conductive film 205. The photoresist pattern 207 is formed using a photolithography and development process for patterning a predetermined area of the second photoresist. At this time, it is important that the second photoresist pattern is formed such that the metal layer area other than the metal layer area to which a contact region is connected, is not connected to the lower contact. For this purpose, as described in FIG. 2, a profile of the second photoresist pattern 207 is varied.

Referring to FIG. 3D, a predetermined region of the metal mask 206 is etched by performing a photolithography and development process in accordance with the second photoresist pattern 207 and the second photoresist pattern 207 is stripped. I-light of a wavelength of 365 nm, KrF of 248 nm, ArF of 193 nm, EUV of 157 nm, etc., may be used as a light source in the photolithography. The conductive film 205 is patterned using an etching process to form the contact plug 205a and metal layer 205b.

According to the invention, in forming metal layers to be connected to the contact, by forming a pattern in which the metal layers are widened to the left and right sides around the contact, overlapping between the contact and metal layer can be avoided and thus an overlay margin can be ensured to improve the reliability of a device by only a variation of a metal mask pattern without additional equipment, even in case of a narrow metal layer width.

The invention has been described in conjunction with the specific embodiments outlined above, many alternatives, modifications, and variations may be apparent to those skilled in the art. Accordingly, the preferred embodiments of the invention as set forth above are intended to be illustrative, and not limiting. Various changes may be made without departing from the spirit and scope of the invention as defined in the following claims.

What is claimed is:

1. A metal layer structure of a semiconductor memory device including:
   a first metal layer to be connected to a contact plug; and
   a plurality of second metal layers that are formed in parallel at a second spaced distance around the first metal layer,
   wherein a spaced distance of the second metal layers nearest the first metal layer maintains the second spaced distance which is wider than a first spaced distance of the second metal layers around the contact plug, and the spaced distance of the second metal layer next to the first metal layer maintains a third spaced distance, which is narrower than the second spaced distance, and the spaced distance between adjacent second metal layers gradually decreases to eventually be equal to the first spaced distance, for the second metal layers farthest from the first metal layer.

2. A metal layer structure of a semiconductor memory device of claim 1, wherein the second metal layers have a length corresponding to 1.2 times to 2.0 times an overlapped length of the first metal layer and the contact plug around the contact plug, thereby maintaining a spaced distance from the first metal layer which is wider than the first spaced distance.

3. A metal layer structure of a semiconductor memory device of claim 1, wherein the spaced distance between adjacent second metal layers decreases gradually by 1 nm to 10 nm, for second metal layers farther from the first metal layer.

4. A metal layer structure of a semiconductor memory device of claim 1, wherein the spaced distance between the seventh second metal layer and eighth second metal layer near from the first metal layer, maintains the first spaced distance.

5. A metal layer structure of a semiconductor memory device of claim 1, wherein the first spaced distance is 100 nm, and the second spaced distance 115 nm.

6. A metal layer structure of a semiconductor memory device of claim 1, wherein the second metal layers are formed to have first and second widths on the region where the spaced distance next to the second metal layer gets wider, which is narrower than the first width.

7. A metal layer structure of a semiconductor memory device of claim 1, wherein the width of the second metal layer decreases by 1 nm to 10 nm as the second metal layers are further from the first metal layer.

8. A metal layer structure of a semiconductor memory device of claim 1, wherein the first width is 100 nm.

* * * * *